(12) United States Patent
Cheng et al.

(10) Patent No.: US 10,998,229 B2
(45) Date of Patent: May 4, 2021

(54) TRANSISTOR WITH IMPROVED SELF-ALIGNED CONTACT

(71) Applicant: International Business Machines Corporation, Armonk, NY (US)

(72) Inventors: Kangguo Cheng, Schenectady, NY (US); Zhenxing Bi, Schenectady, NY (US); Juntao Li, Cohoes, NY (US); Dexin Kong, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 10 days.

(21) Appl. No.: 16/173,761

(22) Filed: Oct. 29, 2018

(65) Prior Publication Data

US 2020/0135561 A1    Apr. 30, 2020

(51) Int. Cl.
| | |
|---|---|
| *H01L 29/417* | (2006.01) |
| *H01L 29/423* | (2006.01) |
| *H01L 29/66* | (2006.01) |
| *H01L 21/768* | (2006.01) |
| *H01L 21/8234* | (2006.01) |
| *H01L 21/311* | (2006.01) |

(52) U.S. Cl.
CPC .. *H01L 21/76897* (2013.01); *H01L 21/31116* (2013.01); *H01L 21/76802* (2013.01); *H01L 21/76834* (2013.01); *H01L 21/76877* (2013.01); *H01L 21/823475* (2013.01); *H01L 29/41725* (2013.01); *H01L 29/4238* (2013.01); *H01L 29/66568* (2013.01); *H01L 29/665* (2013.01)

(58) Field of Classification Search
CPC ................................................ H01L 21/76897
See application file for complete search history.

(56) References Cited

U.S. PATENT DOCUMENTS

| | | | |
|---|---|---|---|
| 6,180,530 B1 * | 1/2001 | Liaw | H01L 21/76897 257/E21.507 |
| 8,084,357 B2 | 12/2011 | Chen et al. | |
| 8,497,551 B2 | 7/2013 | Kalnitsky et al. | |
| 9,064,801 B1 | 6/2015 | Horak et al. | |
| 9,245,894 B2 | 1/2016 | Lytle | |
| 9,570,397 B1 | 2/2017 | Fan et al. | |
| 9,570,583 B2 | 2/2017 | Cai et al. | |
| 9,721,888 B2 | 8/2017 | Chang et al. | |
| 9,847,403 B2 | 12/2017 | Lin et al. | |
| 9,929,046 B2 | 3/2018 | Cheng et al. | |
| 10,276,391 B1 * | 4/2019 | Zang | H01L 29/665 |
| 2008/0076216 A1 | 3/2008 | Pae et al. | |

(Continued)

*Primary Examiner* — Raj R Gupta
(74) *Attorney, Agent, or Firm* — Amin, Turocy & Watson, LLP

(57) ABSTRACT

Systems, methods, and devices facilitating a transistor with an improved self-aligned contact are provided. In one example, a method comprises depositing a dielectric layer onto a first gate region and a second gate region of a semiconductor device, wherein the first gate region and the second gate region are separated by a substrate contact region, and wherein the dielectric layer has a first etch sensitivity to an inter-layer dielectric; and depositing a sacrificial layer onto the dielectric layer, wherein the sacrificial layer has a second etch sensitivity to the inter-layer dielectric that is greater than the first etch sensitivity.

7 Claims, 14 Drawing Sheets

(56) References Cited

U.S. PATENT DOCUMENTS

| | | | |
|---|---|---|---|
| 2010/0176512 A1* | 7/2010 | Yang | H01L 23/5226 257/754 |
| 2015/0333136 A1* | 11/2015 | Xie | H01L 21/76831 257/384 |
| 2017/0062413 A1* | 3/2017 | Basker | H01L 21/8234 |

* cited by examiner

TRANSISTOR WITH IMPROVED SELF-ALIGNED CONTACT

BACKGROUND

The subject disclosure relates to semiconductor devices, and more specifically, to contact structures for semiconductor devices and processes for fabricating the same.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, and methods that facilitate transistors with improved self-aligned contacts are described.

According to an embodiment, a semiconductor device can include a substrate and a contact cap on a gate surface of the semiconductor device, where the contact cap extends from the gate surface to a first distance from the substrate of the semiconductor device. The semiconductor device can also include a substrate contact on a non-gate surface of the semiconductor device, where the substrate contact extends from the substrate of the semiconductor device to a second distance from the substrate of the semiconductor device that is larger than the first distance. The semiconductor device can further include a second (CA) contact on the substrate contact, where the CA contact envelops at least a portion of the substrate contact.

According to another embodiment, a method can include depositing a dielectric layer onto a first gate region and a second gate region of a semiconductor device, where the first gate region and the second gate region are separated by a substrate contact region, and where the dielectric layer has a first etch sensitivity to an inter-layer dielectric. The method can further include depositing a sacrificial layer onto the dielectric layer, where the sacrificial layer has a second etch sensitivity to the inter-layer dielectric that is greater than the first etch sensitivity.

According to a further embodiment, a semiconductor device can include a substrate, a gate on the substrate that extends from the substrate to a first distance from the substrate, a spacer positioned adjacent to the gate on the substrate, the spacer extending from the substrate to a second distance from the substrate that is less than the first distance, and a contact cap on the gate and the spacer, the contact cap extending from the gate and the spacer to a third distance from the substrate that is greater than the first distance and the second distance.

DETAILED DESCRIPTION

Figure 1:
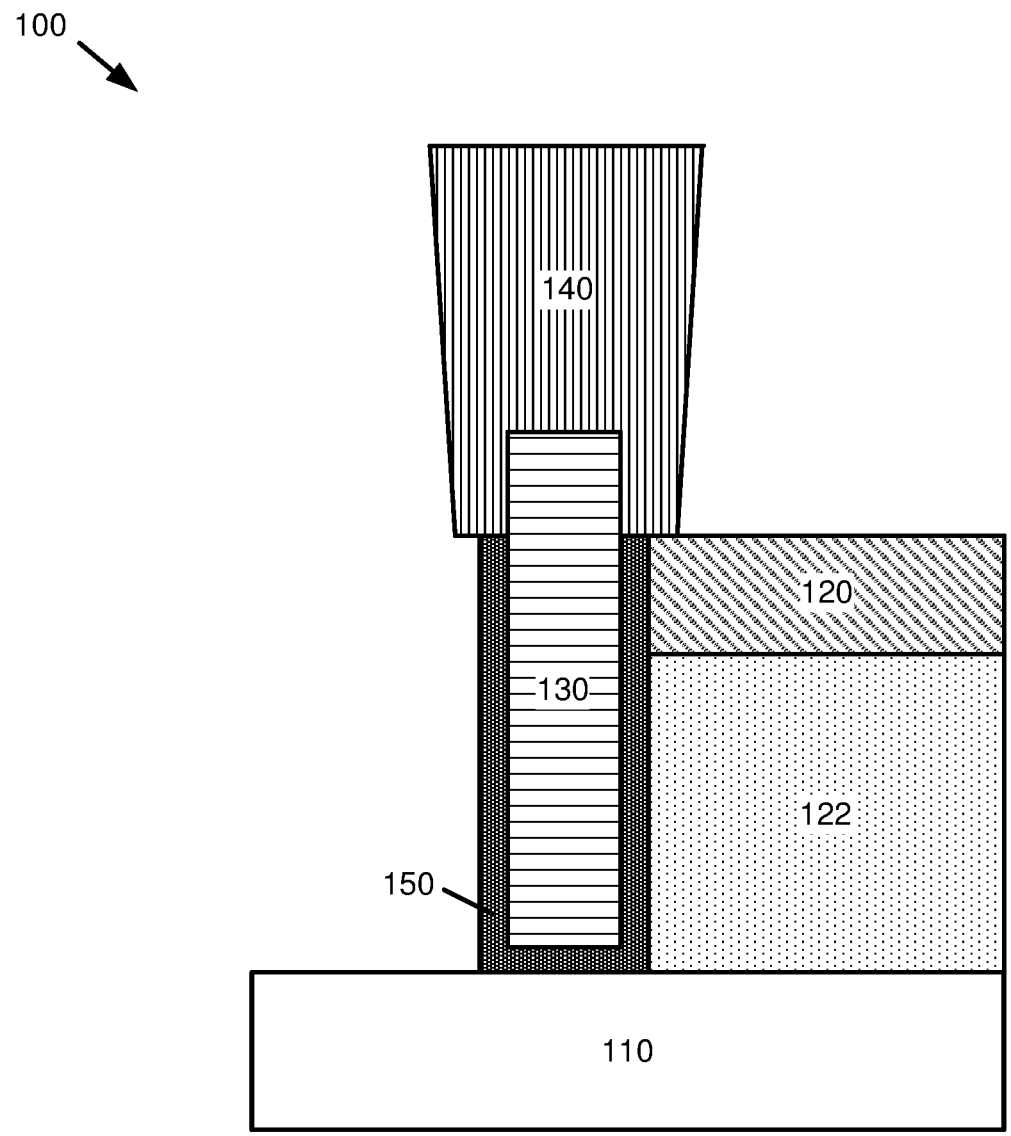
FIG. 1 is a simplified diagram of an example, non-limiting semiconductor device that facilitates an improved self-aligned contact according to one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Described herein are semiconductor devices with improved self-aligned contacts and techniques for fabricating the same. In the field of transistors, a self-aligned contact is a contact on a semiconductor device that utilizes previously fabricated features as a mask for the positioning of additional features. This method of self-alignment can be desirable as it enables the positioning of semiconductor device features without external or specialized alignment techniques. As semiconductor devices advance and reduce in size, e.g., as 10 nm fabrication processes become more prevalent, self-aligned contacts can be highly desirable due to highly scaled gate pitch and/or other factors.

A self-aligned contact (SAC) for a semiconductor device generally includes an insulator cap that is positioned on top of a metal gate to electrically isolate the source and drain of the device from the gate metal. The SAC cap can be fabricated using a dielectric material such as silicon nitride (SiN). However, if the material of the SAC cap has limited etch sensitivity with an associated inter-level dielectric (ILD), erosion of the SAC cap can occur during device fabrication, which can cause yield and/or reliability issues. Further, it is expected that these problems will be exacerbated as semiconductor fabrication techniques become more precise, e.g., as the technology moves toward 7 nm and/or smaller nodes.

In an aspect, various devices and techniques described herein improve SAC formation by using a bi-layer SAC cap that is formed on top of both the metal gate and its adjacent spacers. The bi-layer cap can include a first layer of a dielectric material (e.g., SiN, etc.) that is positioned directly on top of the metal gate and/or spacers. The second layer of the bi-layer cap can include a metallic material (e.g., titanium nitride, TiN) and/or other suitable materials. The material of the second layer can exhibit a high etch sensitivity to the ILD dielectric, thereby reducing SAC cap erosion during the SAC etching process. The layers of the SAC cap and their corresponding materials are described in further detail with respect to the Figures that follow. In an aspect, the second cap layer can be removed at a later stage in the SAC fabrication process, e.g., during SAC trench metallization and planarization.

By utilizing an improved SAC cap structure as provided in the following description, various advantages can be realized. For instance, SAC cap and spacer loss can be reduced by using a highly selective sacrificial cap layer. Integrity of the SAC and spacers can be robustly preserved during device fabrication, thereby mitigating yield and reliability issues. Erosion of the SAC cap during device fabrication can be reduced, thereby preventing shorting of device contacts to the metal gate and/or dielectric breakdown. Other advantages of the embodiments described herein can also be realized.

With reference now to the drawings, FIG. 1 is a simplified diagram of an example, non-limiting semiconductor device 100 that facilitates an improved self-aligned contact according to one or more embodiments described herein. Repetitive description of like elements employed in other embodiments described herein is omitted for sake of brevity. It should be appreciated that, for simplicity of description, various features of semiconductor device 100 as shown in FIG. 1 have been omitted or simplified to facilitate a basic understanding of various embodiments as provided herein. These and/or other features are described in further detail with respect to the Figures that follow as appropriate to provide context to the principles described herein. It should additionally be appreciated that, in the description that follows, references to various device layers or features being "above," "on top of," etc., other layers or features and/or other similar qualifiers are intended merely to describe the relative positions of those layers or features and are not intended to limit a device or its associated description to any specific orientation. For instance, in the case of an inverted device, a first layer or feature could be above and/or on top of a second layer or feature relative to the device even if the first layer or feature is below the second layer or feature in absolute terms, e.g., with respect to the earth.

As shown in FIG. 1, semiconductor device 100 can include a substrate 110, which can be configured in any suitable manner to facilitate operation of semiconductor device 100. By way of example, the substrate 110 can be a silicon substrate and/or otherwise composed of one or more semiconductor materials. Other substrate compositions are also possible. In addition, the substrate 110 can include other device structures such as, for example, transistors, diodes, capacitors, resistors, isolation structures, etc.

Semiconductor device 100 as shown in FIG. 1 can further include a contact cap 120, also referred to herein as a self-aligned contact (SAC) cap, on a gate surface of semiconductor device 100. In an aspect, the gate surface can be a surface of a gate region 122 as shown in FIG. 1. While the gate region 122 is shown as a single region in FIG. 1, the gate region 122 can include multiple components, such as a metal gate and/or associated spacers. Specific, non-limiting examples of gate region compositions are described in more detail with respect to FIG. 2. As further shown in FIG. 1, the contact cap 120 can extend from the gate surface associated with the gate region 122 to a first distance from the substrate 110, e.g., from the top surface of the substrate 110 as shown by FIG. 1 to the top surface of the contact cap 120 as further shown by FIG. 1.

As further shown by FIG. 1, semiconductor device 100 can also include a substrate contact 130 on a non-gate surface of semiconductor device 100, e.g., a surface of the substrate 110 that is physically separate from the gate region 122. In various aspects, the substrate contact 130 can be a trench contact, a trench silicide (TS) contact, and/or any other suitable contact type that is positioned on or near the surface of the substrate 110. In an aspect, the substrate contact 130 can be directly adjacent to the substrate 110, or alternatively a contact liner 150 can be positioned between the substrate contact 130 and the substrate 110. In another aspect, the contact liner 150 can be positioned between the substrate contact 130 and the gate region 122 as shown in FIG. 1 to prevent direct contact between the substrate contact 130 and the gate region 122.

As additionally shown by FIG. 1, the substrate contact 130 can be formed and/or otherwise positioned such that it extends from the substrate 110 of semiconductor device 100 to a second distance from the substrate 110, e.g., from the top surface of the substrate 110 as shown by FIG. 1 to the top surface of the substrate contact 130 as further shown by FIG. 1. In an aspect, the distance to which the substrate contact 130 extends from the substrate 110 can be larger than the distance to which the contact cap 120 extends from the substrate, e.g., such that a portion of the substrate contact 130 extends past the contact cap 120 with reference to the substrate 110.

As additionally shown by FIG. 1, semiconductor device 100 can also include a second contact, referred to herein as a CA contact 140. The CA contact 140 can be positioned as shown by FIG. 1 such that it envelops (encompasses, surrounds, etc.) at least a portion of the substrate contact 130, e.g., the portion of the substrate contact 130 that extends past the contact cap 120 with reference to the substrate 110.

Turning next to FIGS. 2-12, respective stages of an example technique for fabricating a transistor with an improved self-aligned contact, e.g., a transistor similar to semiconductor device 100, are shown. It should be appreciated, however, that the technique shown in FIGS. 2-12 is merely one way of fabricating a transistor in accordance with various embodiments described herein and that other techniques are also possible. Accordingly, specific references to transistor structures and/or materials given in the context of FIGS. 2-12 are intended to be non-limiting examples of various structures and/or materials that could be used, and other structures and/or materials could also or alternatively be used without departing from the scope of the description and/or claimed subject matter.

Figure 2:
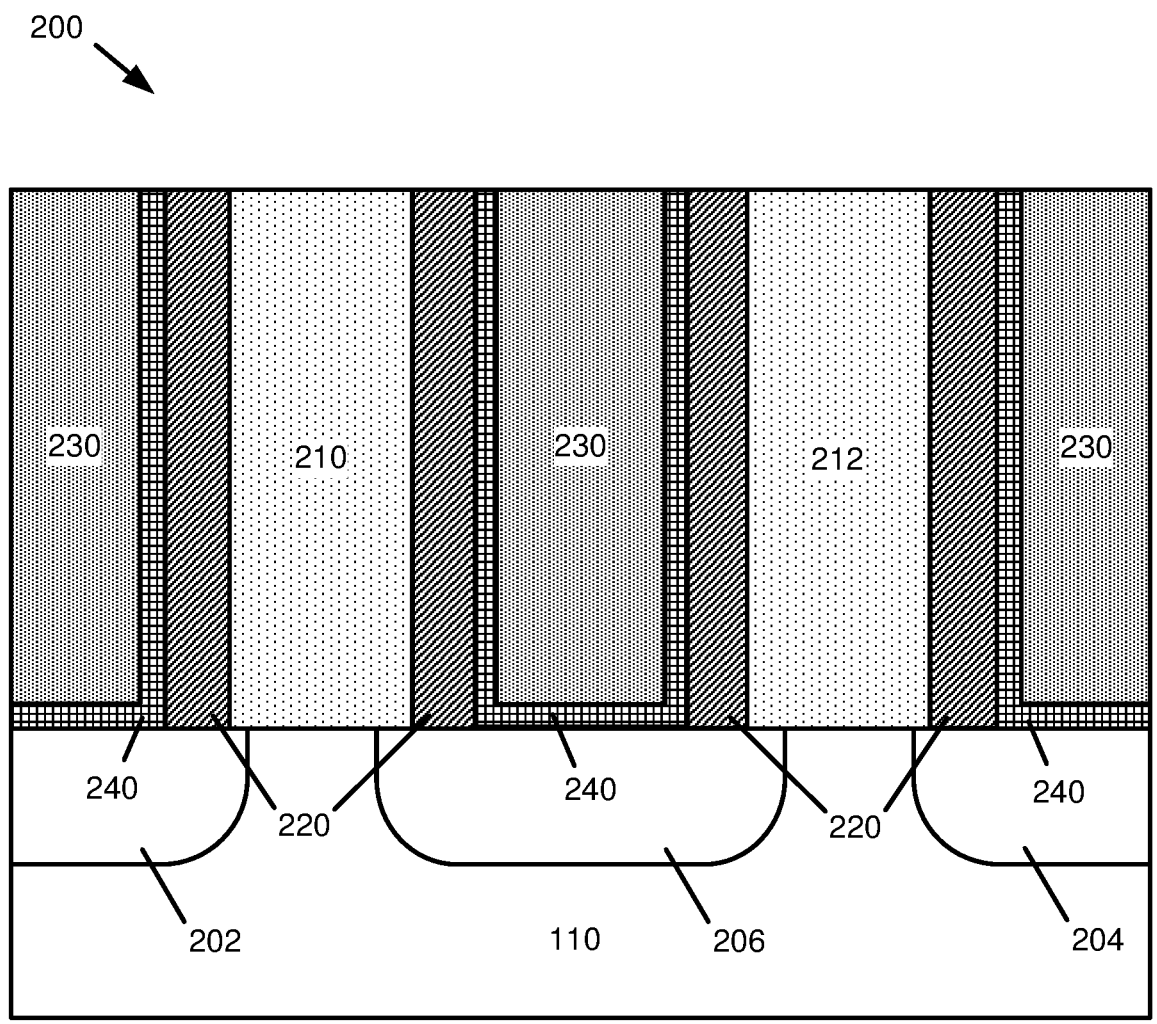
FIGS. 2-12 are diagrams depicting respective steps of an example, non-limiting process of fabricating a transistor with an improved self-aligned contact according to one or more embodiments described herein.

With reference first to FIG. 2, diagram 200 illustrates an example of an initial transistor structure that can be utilized to fabricate a transistor with an improved self-aligned contact. As shown, the structure in diagram 200 can include a substrate 110, which can be doped in various manners as appropriate for a desired transistor type. For instance, the substrate 110 shown in diagram 200 can be doped to include source regions 202, 204 and a drain region 206. Other doping schemes could also be used. By way of specific, non-limiting example, doping techniques that could be utilized for the substrate 110 can include, but are not limited to, in-situ doped epitaxy, ion implantation, gas phase doping, plasma doping, plasma immersion ion implantation, cluster doping, infusion doping, liquid phase doping, solid phase doping, and/or any suitable combination of these or other techniques. In some embodiments, dopants can be activated by thermal annealing such as laser annealing, flash annealing, rapid thermal annealing (RTA), and/or any suitable combination of these or other techniques.

As further shown by diagram 200, the transistor structure can include respective gates 210, 212. In an aspect, the gates 210, 212 can be composed of a conductive material (e.g., the gates 210, 212 can be metal gates). Also or alternatively, one or more materials that compose the gates 210, 212 can include a gate dielectric.

In an aspect, the gate dielectric can comprise any suitable dielectric material, including but not limited to silicon oxide, silicon nitride, silicon oxynitride, high-k materials, or any combination of these materials. Examples of high-k materials can include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, etc. The high-k can further include dopants such as lanthanum, aluminum, magnesium, or the like. In an aspect, the gate dielectric material can be formed by any suitable process or any suitable combination of multiple processes, which can include, but are not limited to, thermal oxidation, chemical oxidation, thermal nitridation, plasma oxidation, plasma nitridation, atomic layer deposition (ALD), chemical vapor deposition (CVD), etc. In some embodiments, the gate dielectric can have a thickness ranging from 1 nm to 5 nm, although other thicknesses could also be used.

Additionally, the gate conductor can include any suitable conducting material. Examples of materials that can be used include, but are not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO2), cobalt silicide (CoSi), nickel silicide (NiSi)), transition metal aluminides (e.g. Ti3Al, ZrAl), TaC, TaMgC, carbon nanotube, conductive carbon, graphene, and/or any suitable combination of these or other materials. The conductive material can further include dopants that are incorporated during or after deposition. In some embodiments, the gate can further include a work function setting layer between the gate dielectric and gate conductor. The work function setting layer can be, for example, a work function metal (WFM). The WFM can be any suitable material, which can include, but is not limited to, a nitride such as titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), or niobium nitride (NbN); a carbide such as titanium carbide (TiC) titanium aluminum carbide (TiAlC), tantalum carbide (TaC), hafnium carbide (HfC); and/or combinations of these or other materials. In some embodiments, a conductive material or a combination of multiple conductive materials can serve as both gate conductor and WFM. The gate conductor and WFM can be formed by any suitable process or any suitable combination of multiple processes, which can include, but are not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

In another aspect, the gates 210, 212 can be positioned adjacent to respective spacers 220. For example, the spacers 220 can be positioned at the sidewalls of the gates 210, 212. The spacers 220 can be formed using one or more materials having a low dielectric constant. For example, the spacers can include materials that can include, but are not limited to, silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabo-nitride (SiOCN), silicon oxide, and/or combinations of these or other materials. In an aspect, the dielectric material can be a low-k material having a dielectric constant that is no higher than a given threshold, e.g., between approximately 5 to approximately 7. The spacers can be formed by any suitable techniques such as, e.g., deposition followed by a directional etch. The deposition can include, by way of example, atomic layer deposition (ALD) and/or chemical vapor deposition (CVD). Additionally, the directional etch can include, by way of example, reactive ion etching (RIE). In an aspect, the gates 210, 212, along with their respective spacers 220, can collectively comprise respective gate regions, such as the gate region 122 in FIG. 1.

As additionally shown by diagram 200, an inter-level dielectric (ILD) can be positioned on the substrate 110 between the gates 210, 212 and their respective spacers 220. In an aspect, the ILD can include a flowable ILD oxide 230 (e.g., silicon oxide, carbon doped silicon oxide, fluorine doped silicon oxide, SiCOH, and/or other suitable material(s)) that fills the gaps between the gates 210, 212 and spacers 220. The ILD can further include respective ILD liners 240 on the sidewalls of the spacers 220 and on top of the substrate 110, e.g., at the source regions 202, 204 and the drain region 206. In one example, the liners 240 can be composed of materials that can include, but are not limited to, silicon nitride (SiN), SiON, SiCON, and/or other suitable material(s).

While diagram 200 as shown in FIG. 2 depicts a specific, non-limiting example of a planar transistor structure, it should be appreciated that the various aspects described herein could be applied in a similar manner to other transistor structures. For instance, the transistor structure shown in diagram 200 could also be a FinFET (fin field effect transistor), a nanosheet transistor, a nanowire transistor, etc.

Figure 3:
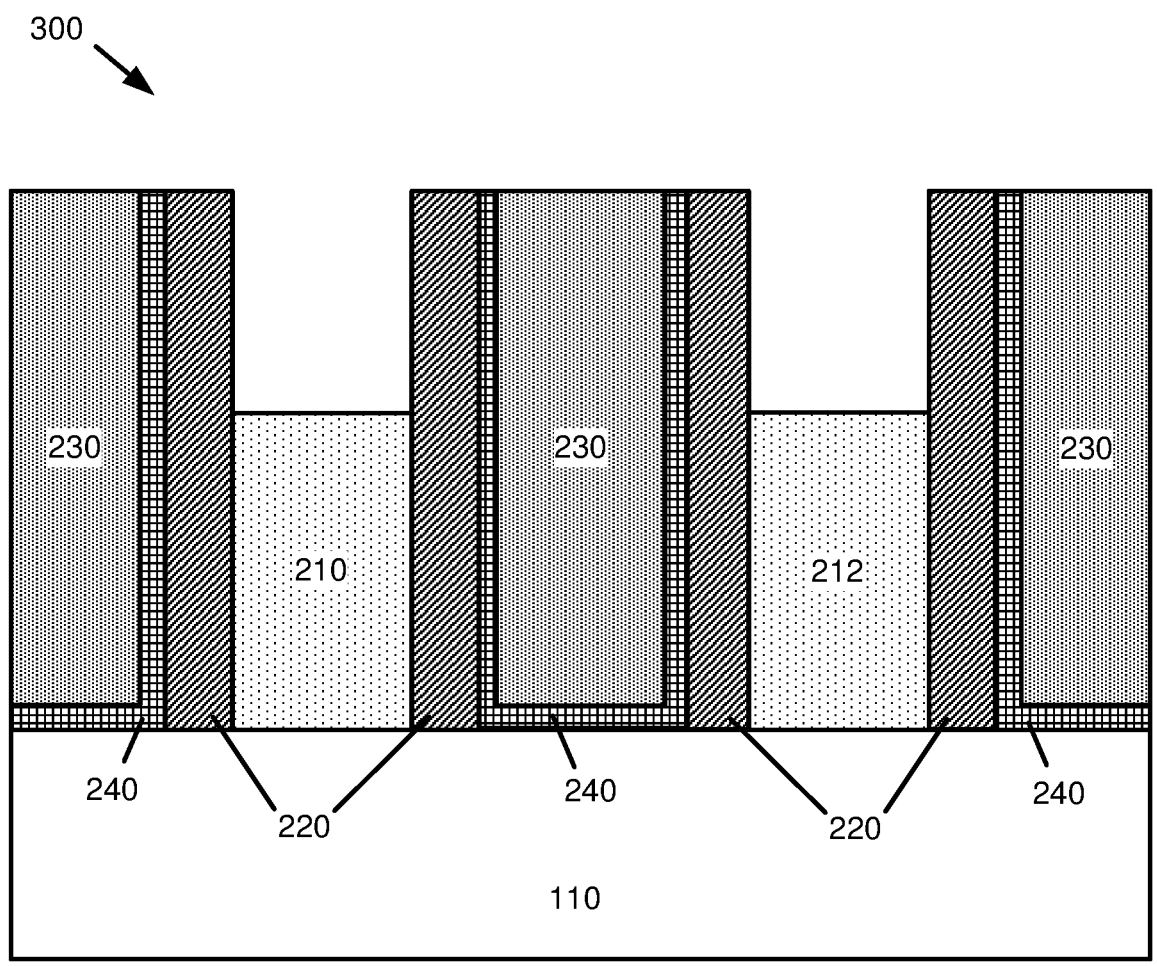

Next, as shown by diagram 300 in FIG. 3, the high-k metal gates 210, 212 can be recessed, e.g., by etching and/or any other suitable technique(s), into the substrate with respect to the other regions on the substrate 110. For instance, the transistor elements on the substrate 110 such as the first gate 210, the second gate 212, and the ILD oxide 230 and associated liners 240 can initially extend as shown by diagram 200 from the substrate 110 to a first distance from the substrate 110. Subsequent to recessing the first gate 210 and the second gate 212 as shown by diagram 300, the first gate 210 and the second gate 212 can extend from the substrate 110 to a second distance from the substrate 110 that is less than the first distance.

In FIG. 3 as well as FIGS. 4-12 that follow, it is noted that specific doping schemes that can be utilized for the substrate 110, e.g., the source regions 202, 204 and the drain region 206, are not shown for clarity of explanation. However, it should be appreciated that the substrate 110 in the steps depicted by these Figures can be doped as shown in FIG. 2 and/or in any other suitable manner.

Figure 4:
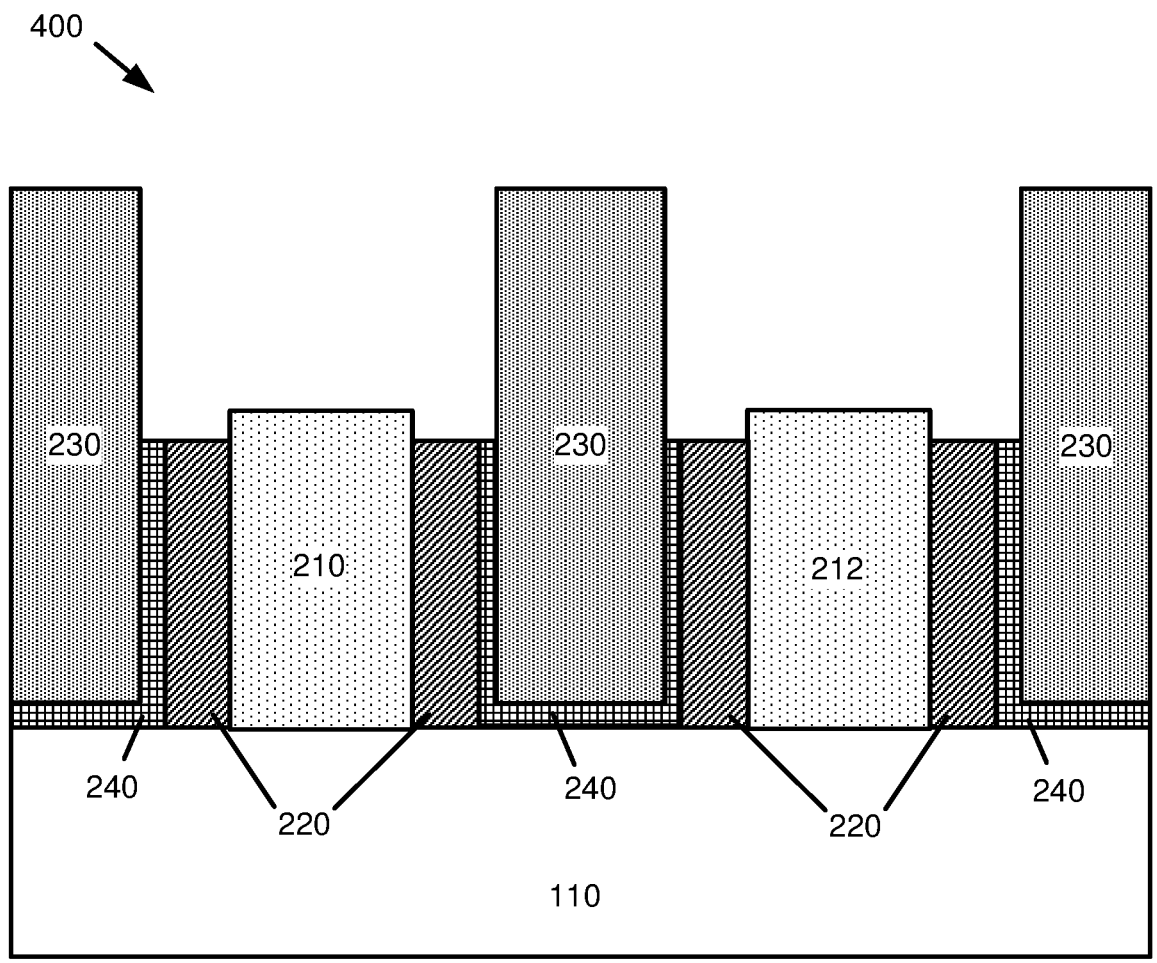

As shown next by diagram 400 in FIG. 4, the exposed spacers 220 and liners 240 can also be etched subsequent to etching the gates 210, 212 as shown by diagram 300. In an aspect, the spacers 220 and/or ILD liners 240 can be removed via wet or dry etching and/or any other suitable technique(s). As further shown by diagram 400, the spacers 220 and liners 240 can be over-etched with respect to the gates 210, 212 such that the surfaces of the respective gates 210, 212 extend further from the substrate 110 than the surfaces of the respective spacers 220 and/or ILD liners 240.

Figure 5:
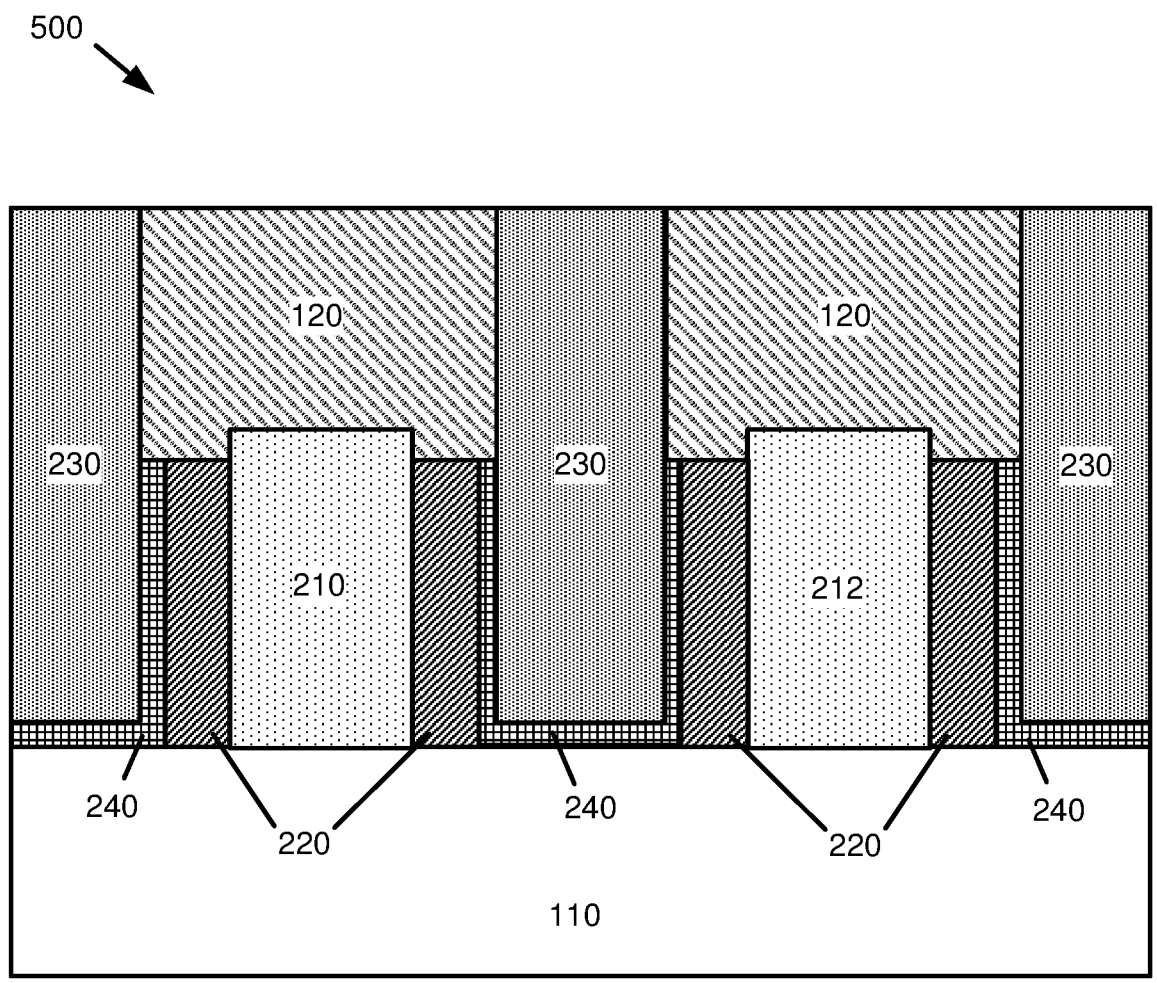

Turning next to diagram 500 in FIG. 5, respective contact caps 120 can be formed onto the gates 210, 212 and corresponding spacers 220, e.g., by depositing a dielectric material onto the gates 210, 212 and spacers 220. In an aspect, dielectric materials used for the contact caps 120 can include, but are not limited to, silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), and/or combinations of these or other suitable materials.

As shown by diagram 500, the contact caps 120 can be deposited as a dielectric layer that is even with the ILD oxide 230 with respect to the substrate 110. In other words, the dielectric layer can be deposited such that it extends from the gates 210, 212 and spacers 220 to the ILD oxide 230. In an aspect, planarization can additionally be performed on the contact caps 120 to facilitate a uniform relative height of the contact caps 120 and ILD oxide 230 with respect to the substrate 110.

Figure 6:
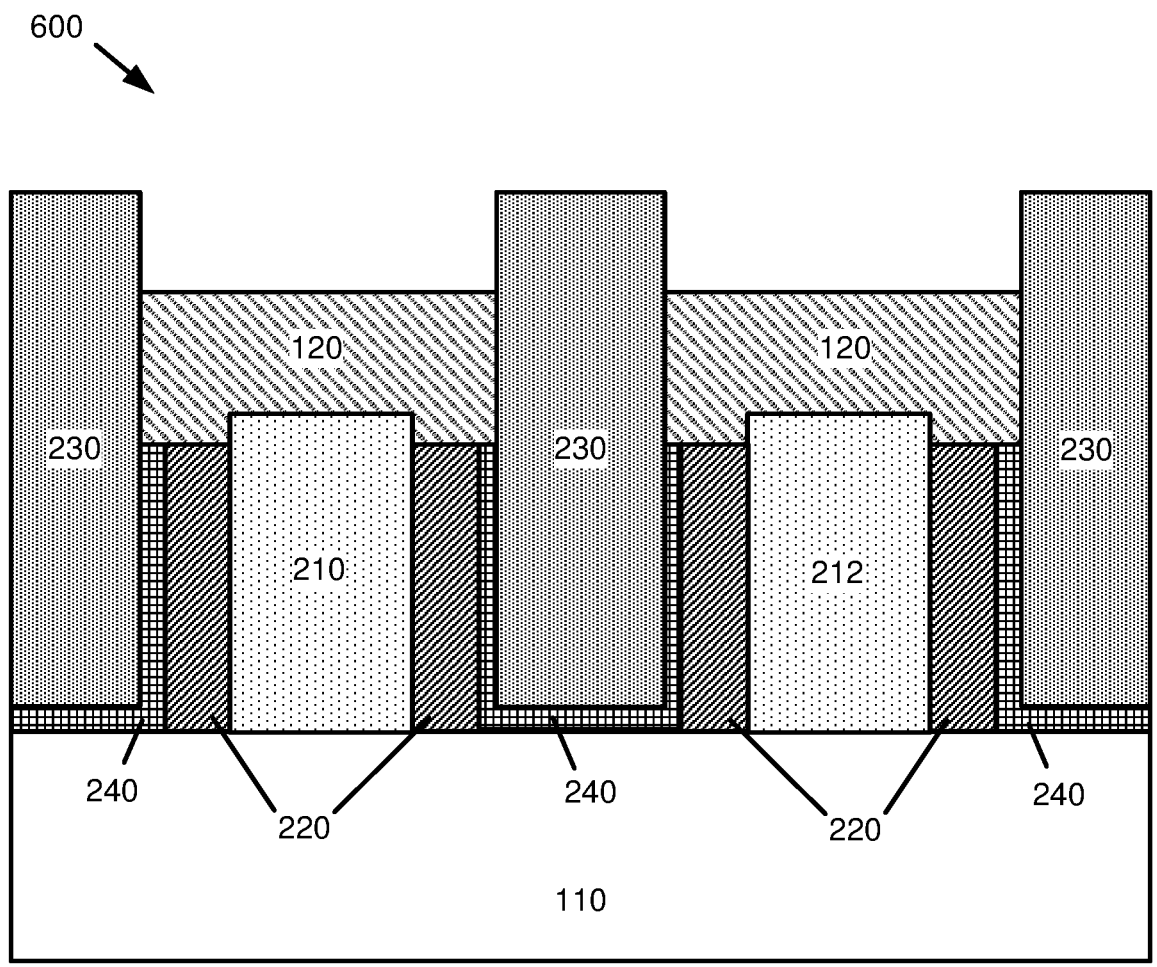

With reference now to FIG. 6, diagram 600 shows that the contact caps 120 formed as shown by diagram 500 can be recessed into the device (e.g., toward the substrate 110 of the device) via etching and/or other suitable technique(s). As shown by diagram 600, the contact caps 120 and/or their constituent dielectric layer can be recessed from the level of the ILD oxide 230 to a distance from the substrate 110 that is between the ILD oxide 230 and the gates 210, 212. In other words, the dielectric layer of the contact caps 120 can be recessed to a third distance from the substrate 110, which is less than a first distance from the substrate 110 associated with the ILD oxide 230 and greater than a second distance from the substrate 110 associated with the gates 210, 212.

Figure 7:
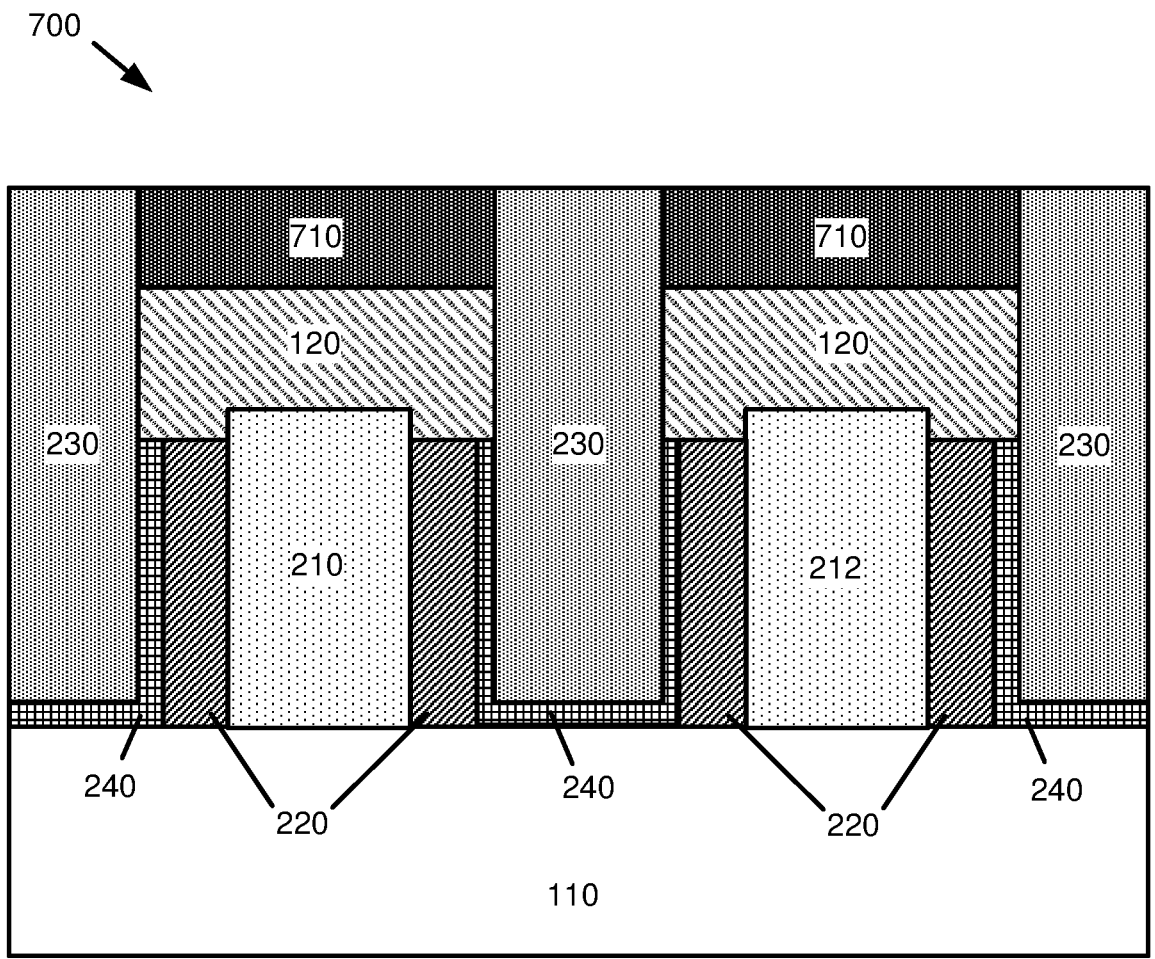

In a subsequent process step as shown by diagram 700 in FIG. 7, a sacrificial cap layer 710 can be formed onto the contact cap 120 formed as shown by diagram 500 and recessed as shown by diagram 600. In some embodiments, the sacrificial cap layer 710 can include a metallic layer. In an aspect, the sacrificial cap layer 710 can be formed by material deposition followed by chemical-mechanical planarization (CMP) and/or by other appropriate processes. The sacrificial cap layer 710 can be composed of and/or otherwise include various materials including, but not limited to, titanium nitride (TiN), tantalum nitride (TaN), hafnium nitride (HfN), niobium nitride (NbN), tungsten nitride (WN), tungsten carbon nitride (WCN), and/or other suitable materials. As shown by diagram 700, the sacrificial cap layer 710 can be deposited and/or planarized such that it is even with the ILD oxide 230 with respect to the substrate 110. Stated another way, the sacrificial cap layer 710 can be deposited such that it extends to the same distance from the substrate 110 as the ILD oxide 230.

In an aspect, the sacrificial cap layer 710 formed as shown by diagram 700, along with the dielectric contact cap 120, can collectively operate as a bi-layer SAC cap formed on top of the gates 210, 212 and spacers 220. As noted above, the first layer of the bi-layer SAC cap can be a dielectric, e.g., the dielectric contact cap 120, that is formed directly onto the gates 210, 212 and spacers 220 as described above. The second layer of the bi-layer SAC cap, e.g., the sacrificial cap layer 710, can be composed of one or more metallic materials or other suitable materials. In an aspect, one or more materials of the sacrificial cap layer 710 can have a higher etch sensitivity to the ILD (e.g., the ILD oxide 230) than the materials of the contact cap 120. In other words, the contact cap 120 can have a first etch sensitivity to the ILD, and the sacrificial cap layer 710 can have a second etch sensitivity to the ILD that is greater than the first etch sensitivity. In an aspect, due to the high etch sensitivity between the sacrificial cap layer 710 and the ILD, erosion of the contact cap 120 and the low-k spacers 220 during SAC trench reactive-ion etching (RIE) can be reduced, thereby increasing the structural and electrical integrity of the underlying transistor device.

In another aspect, the sacrificial cap layer 710 shown by diagram 700 can serve as a sacrificial layer, such that the sacrificial cap layer 710 can be removed (e.g., as described below with respect to FIG. 10) at a subsequent stage of the transistor fabrication process. For instance, the sacrificial cap layer 710 can be removed subsequent to SAC trench metallization and planarization as further described below.

Figure 8:
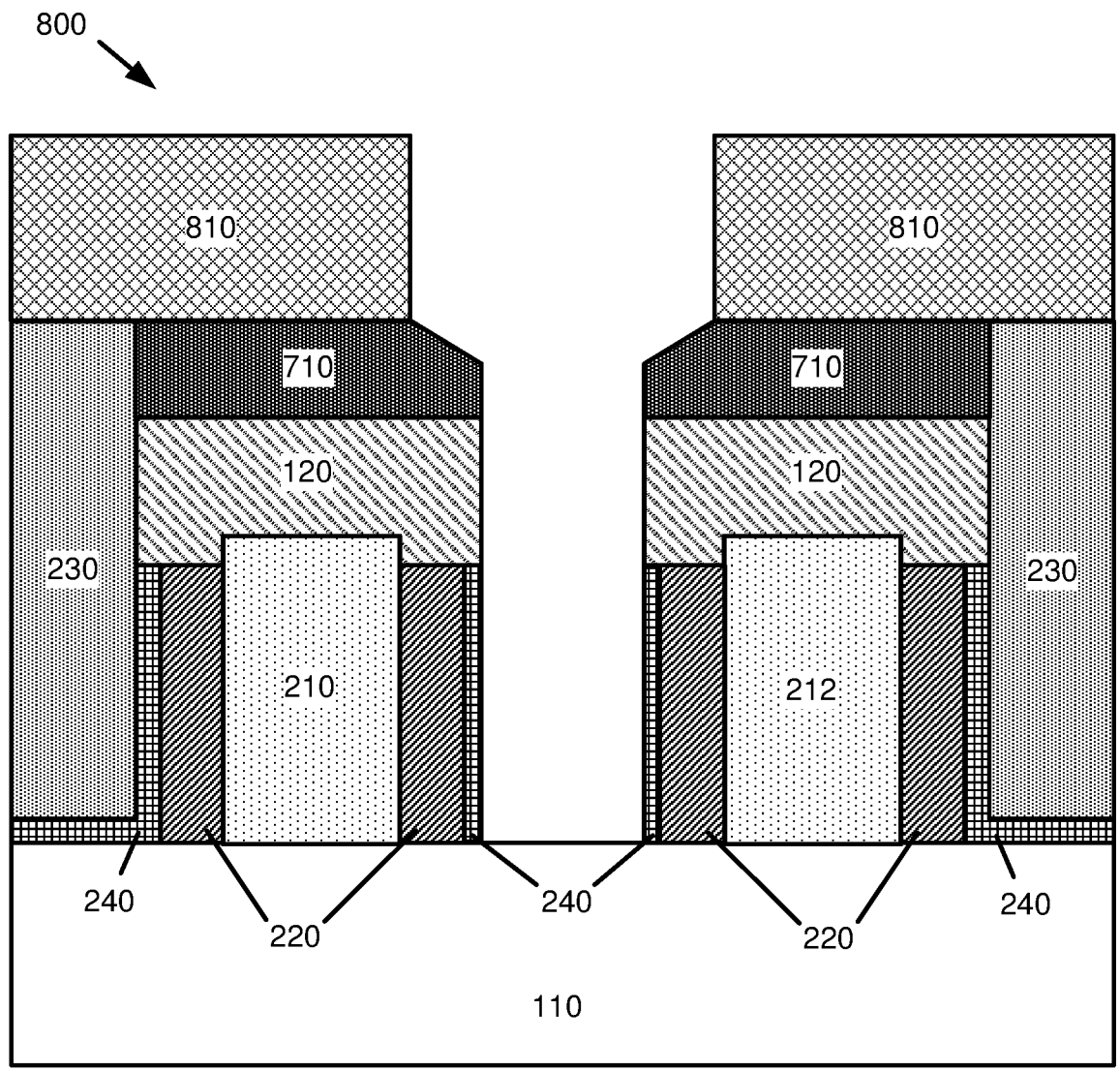

Following deposition of the sacrificial cap layer 710 as shown by diagram 700, the transistor fabrication process can continue as shown by diagram 800 in FIG. 8. As diagram 800 illustrates, a mask 810, e.g., a trench contact mask, can be applied to the top of the sacrificial cap layer 710 and/or one or more areas of the ILD oxide 230 to facilitate removal of the ILD oxide 230 and ILD liner 240 between the gates 210, 212 in order to facilitate the subsequent formation of a substrate contact at the area of the etched region. In an aspect, the etched substrate contact region as shown in diagram 800 can be created (e.g., the ILD oxide 230 and ILD liner 240 can be removed) via RIE and/or other suitable processes, resulting in a contact trench that exposes the corresponding portion of the substrate 110.

As shown by diagram 800, the mask 810 need not be precisely aligned to the edges of the sacrificial cap layer 710, and at least a portion of the sacrificial cap layer 710 adjacent to the desired contact trench can be left exposed during the etching process. Because the contact trench RIE as shown by diagram 800 can be highly selective to the sacrificial cap layer 710, e.g., in relation to the dielectric contact cap 120, erosion of the sacrificial cap layer 710 during etching can be reduced in relation to expected erosion of an uncovered dielectric contact cap 120 during a similar etching procedure without the sacrificial cap layer 710. As a result, the sacrificial cap layer 710 can protect the contact cap 120 and spacers 220 during the etching process. By way of specific, non-limiting example, the etch sensitivity of the sacrificial cap layer 710 to the ILD oxide 230 can be approximately 1:50, and the etch sensitivity of the sacrificial cap layer 710 to the contact cap 120 can be approximately 1:20. Other sensitivity values are also possible.

Figure 9:
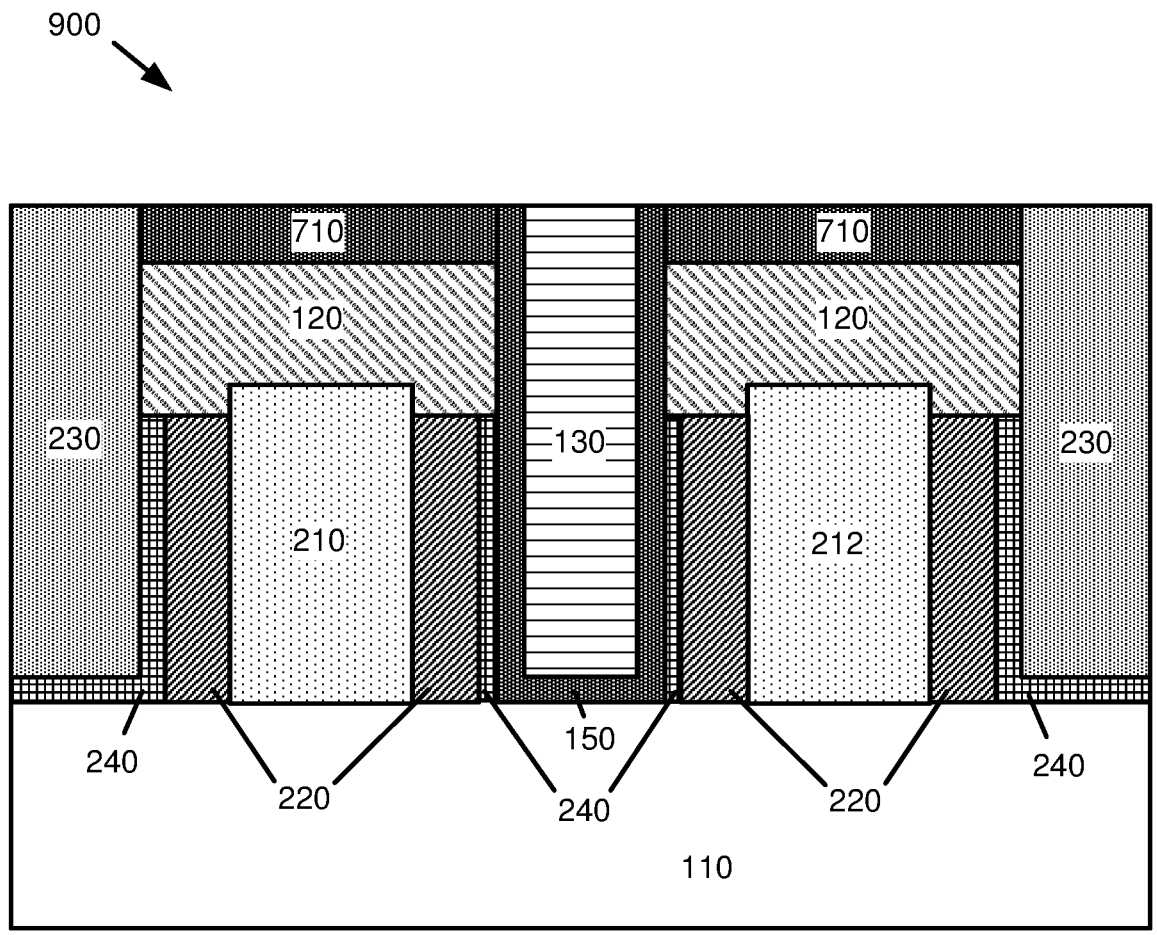

Following etching of the contact trench as shown by diagram 800, the process can continue as shown by diagram 900 in FIG. 9. As diagram 900 illustrates, the mask 810 utilized for etching of the trench contact region can be removed, along with (optionally) a top portion of the sacrificial cap layer 710 and/or remaining ILD oxide 230. Next, a contact liner 150 can be applied to one or more surfaces of the etched substrate contact region. In an aspect, the contact liner 150 can be composed of and/or otherwise include at least one material with which the sacrificial cap layer 710 is composed, e.g., titanium nitride and/or other suitable materials. After applying the contact liner 150, the substrate contact region can be filled with a metallic material such as tungsten, copper, cobalt, or the like, resulting in the formation of a substrate contact 130. In an aspect, the substrate contact 130 can be filled and/or otherwise formed such that it extends from the substrate 110 of the device to approximately the same distance from the substrate 110 as the sacrificial cap layer 710. For example, CMP and/or other planarization procedures can be performed to facilitate evenness of the substrate contact 130 with respect to the sacrificial cap layer 710.

Figure 10:
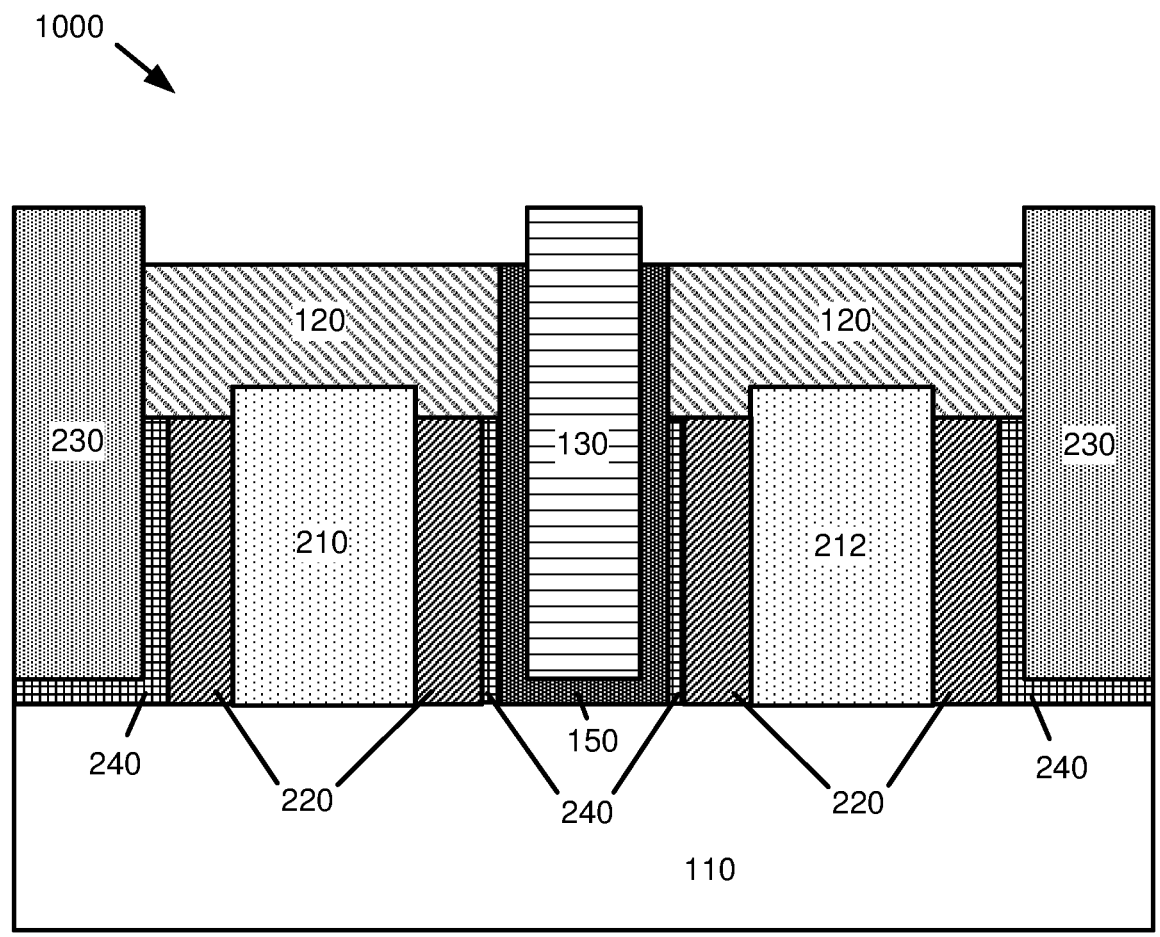

Next, as shown by diagram 1000 in FIG. 10, the sacrificial cap layer 710 can be stripped away from the device, e.g., by etching and/or by other suitable means. In an aspect, an adjacent portion of the contact liner 150 can be removed along with the sacrificial cap layer 710 at this stage, resulting in the substrate contact 130 extending further from the substrate 110 than its surrounding features, e.g., the dielectric layer of the contact cap 120 and the contact liner 150.

Figure 11:
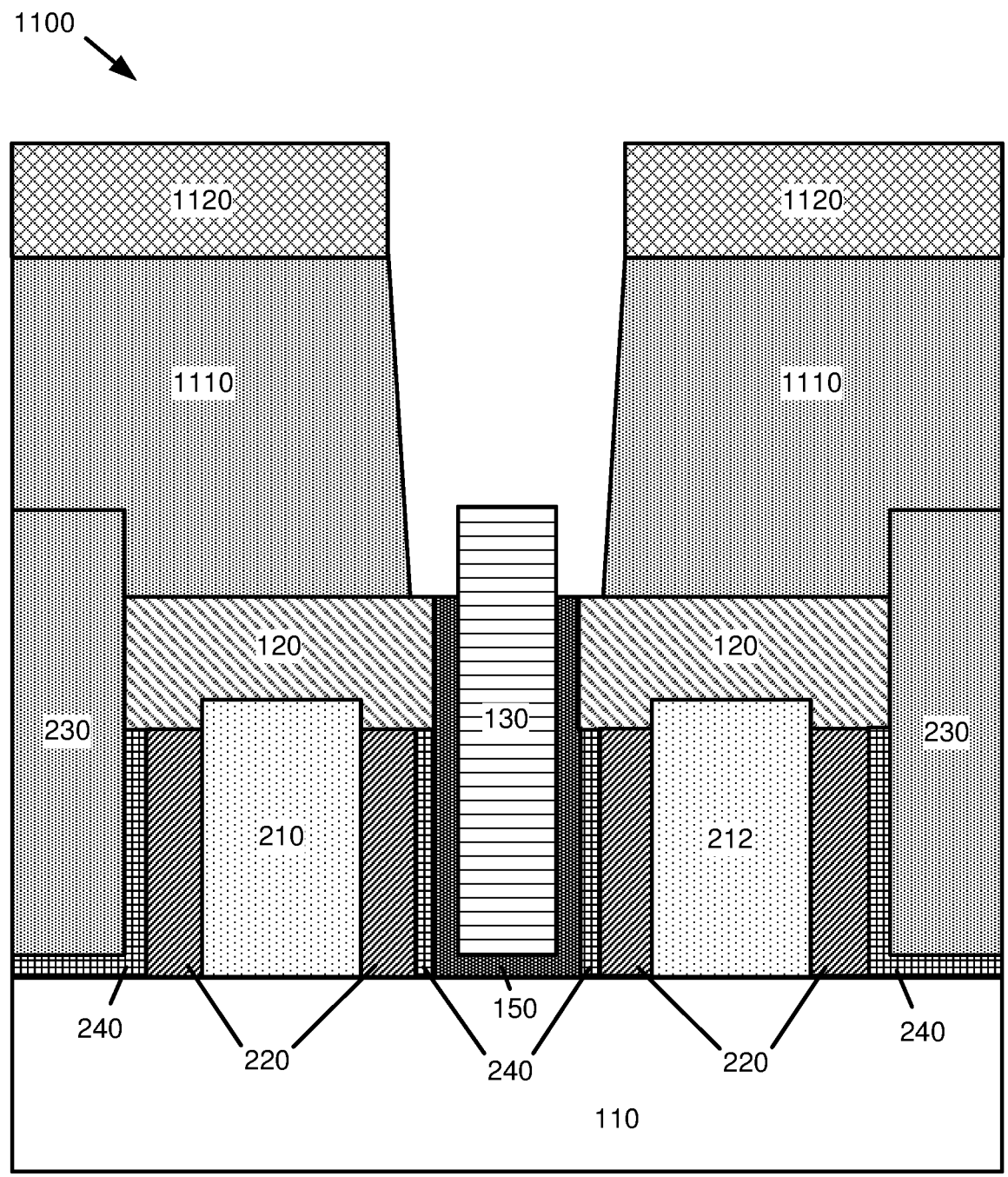

After removal of the sacrificial cap layer 710 as shown by diagram 1000, the process can continue as shown by diagram 1100 in FIG. 11, in which a second ILD 1110 is deposited onto the surface of the transistor at the location of the remaining ILD oxide 230 and at least a portion of the contact caps 120. In an aspect, the second ILD 1110 can include similar materials to those associated with the ILD oxide 230 as generally described above with respect to FIG. 2.

As further shown by diagram 1100, a second mask 1120 can be applied to respective portions of the top surface of the second ILD 1110 to facilitate the formation of a trench in the second ILD 1110, e.g., by RIE and/or other suitable procedures. In an aspect, the trench in the second ILD 1110 can be patterned to define an area of a source and drain contact, or a CA contact, which can be utilized subsequent to fabrication to enable connections between multiple transistors.

Figure 12:
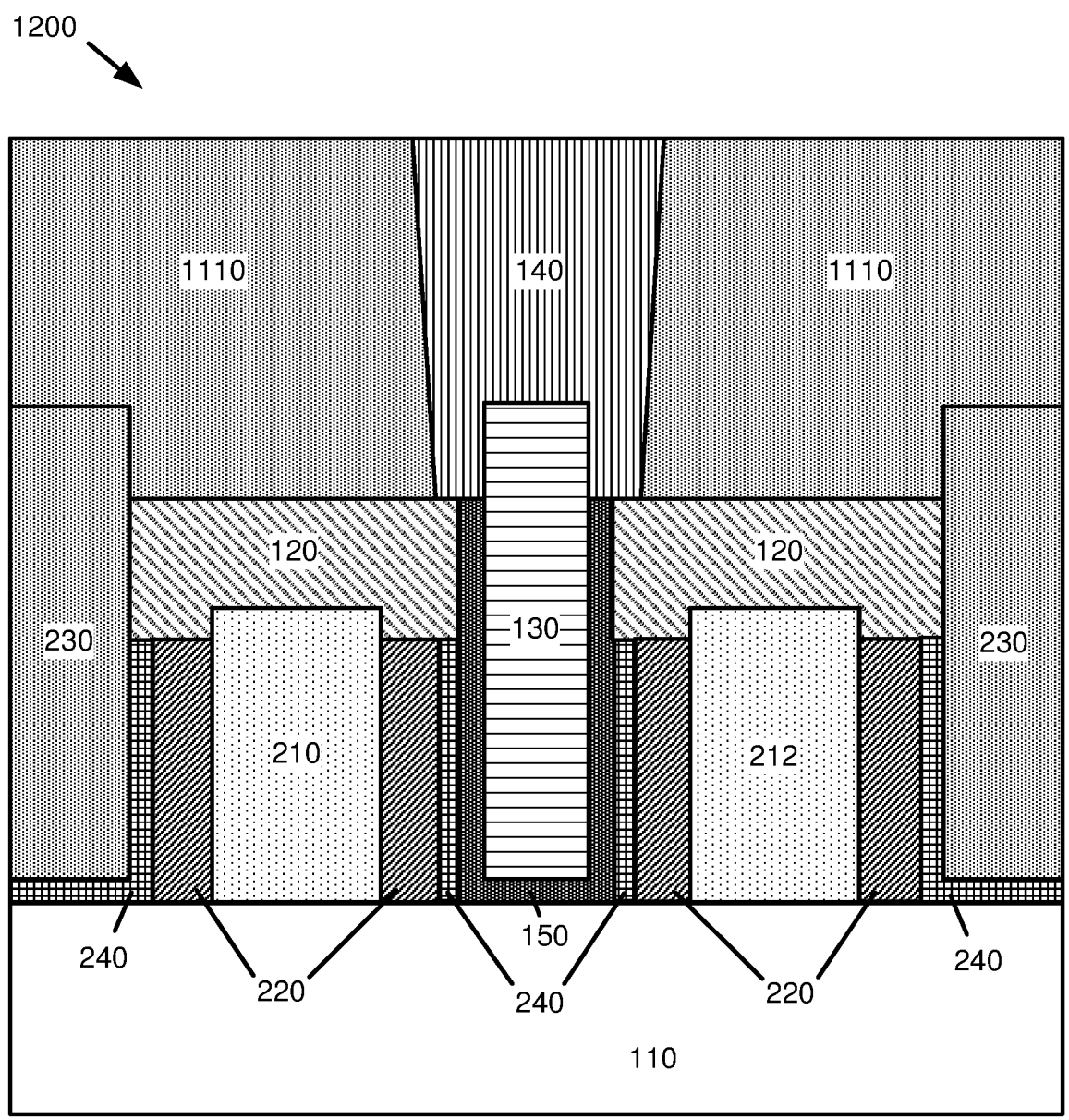

Following formation of the CA trench as shown in diagram 1100, the transistor fabrication process can conclude as shown by diagram 1200 in FIG. 12. As diagram 1200 illustrates, the mask 1120 utilized for formation of the CA trench can be removed (e.g., via etching), and a CA contact 140 can be formed into the CA trench by filling the CA trench with one or more metallic materials such as tungsten, cobalt, copper, or the like. Additionally, a CA contact liner (not shown) can be applied to one or more surfaces of the CA trench, e.g., one or more surfaces adjacent to the second ILD 1110, prior to formation of the CA contact 140. In an aspect, the resulting CA contact 140 can envelop a portion of the substrate contact 130 that extends further from the substrate 110 of the device than the dielectric layer of the contact cap 120.

In an aspect, upon completion of the fabrication process as shown by diagram 1200, a gate contact (not shown) can be formed on the device at the end of the gates 210, 212 orthogonally to the features shown in diagram 1200, e.g., into the page with reference to FIG. 12.

As described above, a technique for fabricating a transistor with an improved self-aligned contact can include a bi-layer SAC cap, e.g., including a dielectric contact cap 120 and a sacrificial cap layer 710, that enables robust SAC contact formation with minimal SAC cap and spacer erosion. As a result of the techniques described herein, yield and reliability of transistors and associated devices can be improved. As further described above, the sacrificial cap layer 710 can be removed during contact metal planarization. Further, as shown by diagram 1200, the transistor fabrication techniques described herein can result in a substrate contact 130 having a top surface that is taller (e.g., extends further from the substrate 110) than the top surface of the contact cap 120, as well as a CA contact 140 that wraps around and/or otherwise envelops the substrate contact 130.

Figure 13:
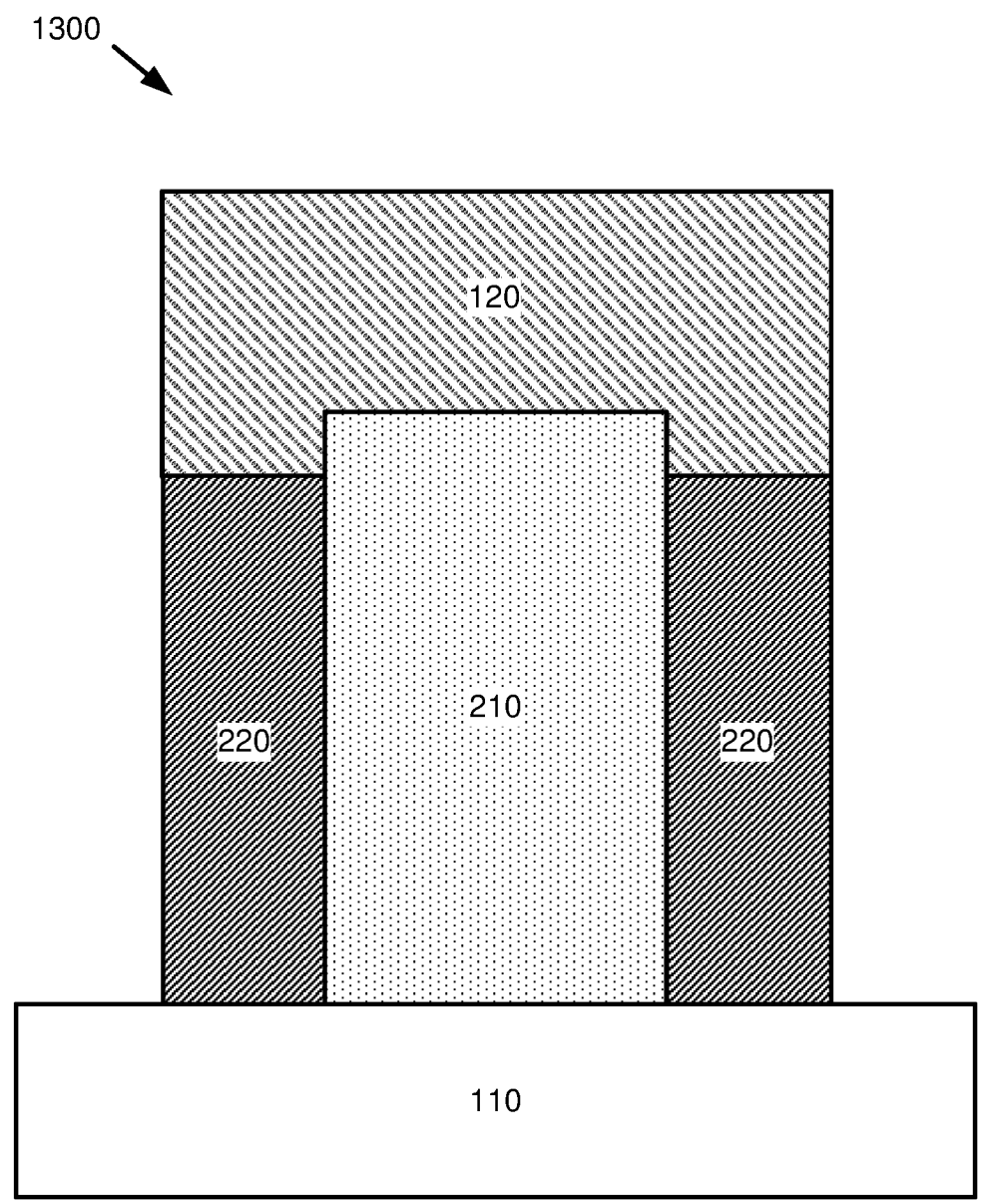
FIG. 13 is a simplified diagram of another example, non-limiting semiconductor device that facilitates an improved self-aligned contact according to one or more embodiments described herein.

Turning next to FIG. 13, a simplified diagram of another example, non-limiting semiconductor device 1300 that facilitates an improved self-aligned contact according to one or more embodiments described herein is illustrated. Repetitive description of like elements employed in other embodiments described herein is omitted for sake of brevity. It should be appreciated that, for simplicity of description, various features of semiconductor device 1300 as shown in FIG. 13 have been omitted or simplified to facilitate a basic understanding of various embodiments as provided herein.

As shown by FIG. 13, the semiconductor device 1300 can include a substrate 110, a gate 210 on the substrate 110 that extends from the substrate 110 to a first distance from the substrate 110, and a spacer 220 positioned adjacent to the gate 210 on the substrate 110. In an aspect, the spacer 220 can extend from the substrate 110 to a second distance from the substrate 110 that is less than the first distance. Stated another way, the gate 210 can extend further with reference to the substrate 110 than its adjacent spacer 220.

As further shown by FIG. 13, the semiconductor device 1300 can also include a contact cap 120 positioned on the gate 210 and the spacer 220. In an aspect, the contact cap 120 can extend from the gate 210 and the spacer 220 to a third distance from the substrate 110 that is greater than both the first distance and the second distance. In other words, the contact cap 120 can extend further with reference to the substrate 110 than the gate 210 and the spacer 220. In another aspect, because the gate 210 extends further with respect to the substrate 110 than the spacer 220, formation of the contact cap 120 on both the gate 210 and spacer 220 results in the formation of an inverted U-shaped contact cap 120.

In an aspect, the contact cap 120 can be composed of one or more suitable materials, which can include, but are not limited to, silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), and/or combinations of these or other materials. In a further aspect, a sacrificial layer, such as a sacrificial cap layer 710 described above, can be deposited and/or otherwise formed onto the contact cap 120 during manufacturing of the semiconductor device 1300. In one example, the contact cap 120 can have a first etch sensitivity to an ILD (not shown) associated with the semiconductor device 1300, and the sacrificial layer can have a second etch sensitivity to the ILD that is greater than the first etch sensitivity, resulting in improved preservation of the contact cap 120 during contact etching, e.g., formation of a CA trench as shown in diagram 800. Similar to the sacrificial cap layer 710 described above, a sacrificial layer applied to semiconductor device 1300 can be composed of materials such as be titanium nitride (TiN), tantalum nitride (TaN), hafnium nitride (HfN), niobium nitride (NbN), tungsten nitride (WN), tungsten carbon nitride (WCN), and/or combinations of these or other materials.

Figure 14:
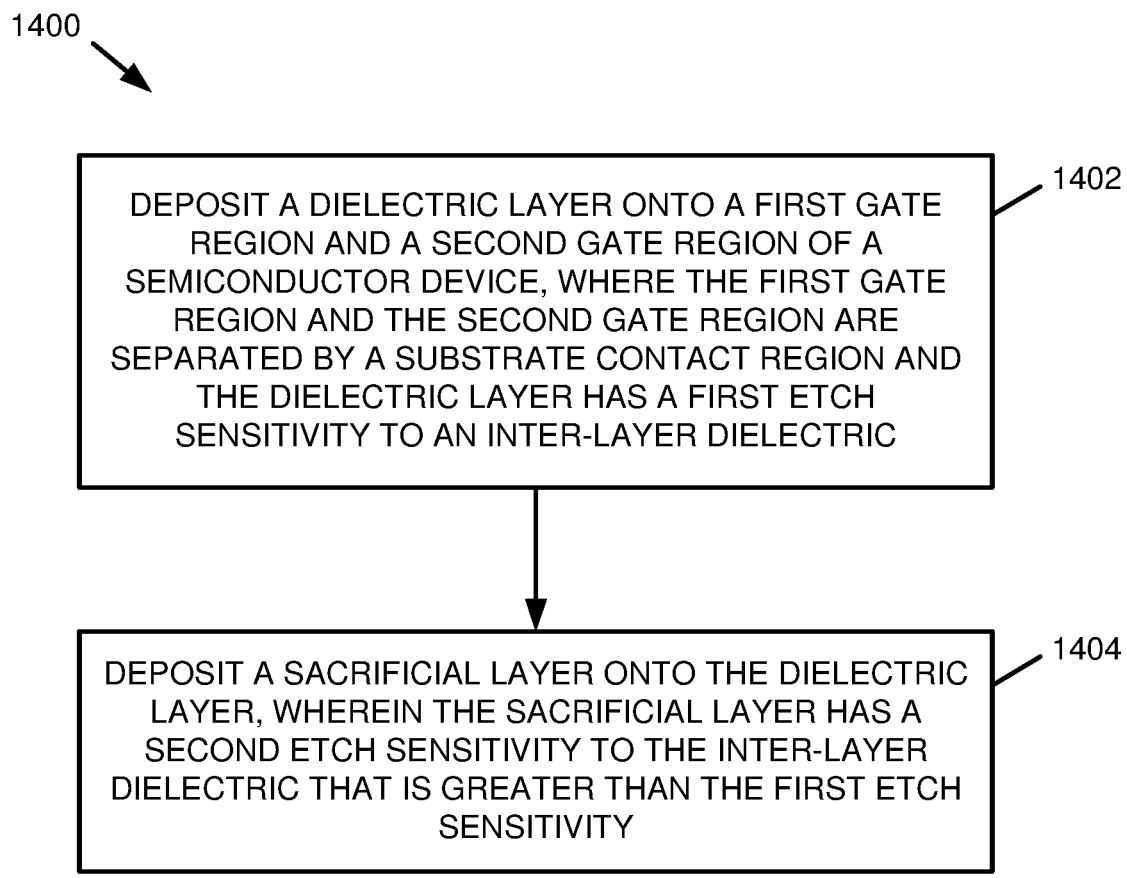
FIG. 14 is a flow diagram of an example, non-limiting method that facilitates fabricating a transistor with an improved self-aligned contact according to one or more embodiments described herein.

FIG. 14 illustrates a flow diagram of an example, non-limiting method 1400 that facilitates fabricating a transistor with an improved self-aligned contact according to one or more embodiments described herein. Repetitive description of like elements employed in other embodiments described herein is omitted for sake of brevity.

At 1402, a dielectric layer (e.g., a dielectric layer associated with a contact cap 120) can be deposited onto a first gate region (e.g., defined by a first gate 210 and its adjacent spacer(s) 220) and a second gate region (e.g., defined by a second gate 212 and its adjacent spacer(s) 220) of a semiconductor device. In an aspect, the first gate region and the second gate region of the semiconductor device can be separated by a substrate contact region (e.g., defined by a substrate contact 130). Additionally, the dielectric layer deposited at 1402 can exhibit a first etch sensitivity to an inter-layer dielectric (e.g., ILD oxides 230 or 1110).

At 1404, a sacrificial layer (e.g., sacrificial cap layer 710) can be deposited onto the dielectric layer formed at 1402. In an aspect, the sacrificial layer deposited at 1404 can have a second etch sensitivity to the inter-layer dielectric that is greater than the first etch sensitivity.

For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies in accordance with the disclosed subject matter. In addition, those skilled in the art will understand and appreciate that the methodologies could alternatively be represented as a series of interrelated states via a state diagram or events. The flowchart and block diagrams in the Figures illustrate the architecture, functionality, and operation of possible implementations of systems, methods, apparatuses and devices according to various embodiments of the present invention. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "electronic device" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, an electronic device and/or a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, electronic devices and/or processors can exploit nano-scale architectures such as, but not limited to, molecular and quantum-dot based transistors, switches and gates, in order to optimize space usage or enhance performance of user equipment. An electronic device and/or a processor can also be implemented as a combination of computing processing units.

What has been described above include mere examples of systems and methods. It is, of course, not possible to describe every conceivable combination of components or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
    a substrate;
    a contact cap on a gate surface of the semiconductor device, wherein the contact cap extends from the gate surface to a first distance from the substrate of the semiconductor device;
    a substrate contact on a non-gate surface of the semiconductor device, wherein the substrate contact extends from the substrate of the semiconductor device to a second distance from the substrate of the semiconductor device that is greater than the first distance; and
    a second contact on the substrate contact, wherein the second contact encapsulates all portions of the substrate contact that extend beyond the first distance.

2. The semiconductor device of claim 1, wherein the gate surface comprises a metal gate surface and at least one spacer surface.

3. The semiconductor device of claim 2, wherein the metal gate surface extends further from the substrate of the semiconductor device than the at least one spacer surface.

4. The semiconductor device of claim 1, further comprising:
    an inter-level dielectric on at least a portion of the contact cap, the inter-level dielectric comprising a trench that defines an area of the second contact.

5. The semiconductor device of claim 4, wherein the trench is formed into the inter-level dielectric at the area of the second contact by reactive-ion etching.

6. A semiconductor device comprising:
    a substrate;
    a gate region on the substrate that extends from the substrate to a first distance from the substrate;
    a contact cap that extends from the gate region to a second distance from the substrate;
    a substrate contact that is physically separate from the gate region, and adjacent to the gate region, wherein the substrate contact extends a third distance from the substrate that is longer that the second distance;
    a contact liner that separates the substrate contact from the substrate and the gate regions; and a second contact that encapsulates all portions of the substrate contact that extend beyond the second distance.

7. The semiconductor device of claim 6, wherein the contact cap comprises silicon nitride.

* * * * *